United States Patent
Sasaki

(10) Patent No.: US 8,212,312 B2
(45) Date of Patent: Jul. 3, 2012

(54) SEMICONDUCTOR DEVICE AND MANUFACTURING METHOD OF THE SAME

(75) Inventor: Yuji Sasaki, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/355,280

(22) Filed: Jan. 20, 2012

(65) Prior Publication Data
US 2012/0112267 A1 May 10, 2012

Related U.S. Application Data

(63) Continuation of application No. 12/687,662, filed on Jan. 14, 2010, now Pat. No. 8,115,250.

(30) Foreign Application Priority Data

Jan. 28, 2009 (JP) .................. 2009-017155

(51) Int. Cl.
*H01L 29/66* (2006.01)
(52) U.S. Cl. .................. 257/329; 257/339; 257/E29.262
(58) Field of Classification Search .................. 257/329, 257/339, E29.262
See application file for complete search history.

(56) References Cited

U.S. PATENT DOCUMENTS

| 7,109,110 | B2 | 9/2006 | Hshieh |
| 7,345,342 | B2* | 3/2008 | Challa et al. .................. 257/341 |
| 2007/0102773 | A1 | 5/2007 | Hisatomu et al. |
| 2007/0222019 | A1 | 9/2007 | Rochefort et al. |
| 2009/0079002 | A1 | 3/2009 | Lee et al. |

FOREIGN PATENT DOCUMENTS

| JP | 2001-298190 | 10/2001 |
| JP | 2004-014554 | 1/2004 |
| JP | 2005-203565 | 7/2005 |
| JP | 2007-173734 | 7/2007 |
| JP | 2007-266505 | 10/2007 |

* cited by examiner

*Primary Examiner* — Trung Q Dang
(74) *Attorney, Agent, or Firm* — Robert J. Depke; Rockey, Depke & Lyons, LLC

(57) ABSTRACT

Disclosed herein is a semiconductor device including: a first conductivity type semiconductor base body; a first conductivity type pillar region; second conductivity type pillar regions; element and termination regions provided in the first and second conductivity type pillar regions, transistors being formed in the element region, and no transistors being formed in the termination region; body regions; a gate insulating film; gate electrodes; source regions; and body potential extraction regions, wherein voids are formed in the second conductivity type pillar regions of the termination region.

10 Claims, 12 Drawing Sheets

SEMICONDUCTOR DEVICE AND MANUFACTURING METHOD OF THE SAME

CROSS REFERENCES TO RELATED APPLICATIONS

The subject matter of application Ser. No. 12/687,662, is incorporated herein by reference. The present application is a Continuation of U.S. Ser. No. 12/687,662, filed Jan. 14, 2010, which claims priority to Japanese Patent Application No. JP 2009-017155 filed with the Japanese Patent Office on Jan. 28, 2009, the entire contents of all is hereby incorporated by reference.

BACKGROUND OF THE INVENTION

1. Field of the Invention

The present invention relates to a semiconductor device for use as a power switching element, and more particularly to a semiconductor device having a super junction structure and a manufacturing method of the same.

2. Description of the Related Art

Recent years have seen a growing demand for thickness and weight reduction of electronic equipment as typified by liquid crystal, plasma and organic EL (Electro-Luminescence) television sets. This has led to a greater demand for size reduction and higher performance of power equipment. As a result, much effort has been put into providing improved performance to power semiconductor elements, and vertical MOSFETs (Metal Oxide Semiconductor Field Effect Transistors) in particular. Such performance improvements include higher withstand voltage, larger current handling capability, lower losses, higher speed and higher breakdown resistance.

The ON resistance and withstand voltage of a vertical MOSFET depends largely on the impurity concentration of its conduction layer, i.e., a first conductivity type region of the MOSFET such as an n-type semiconductor region. The impurity concentration of the conduction layer must be increased to reduce the ON resistance. However, the impurity concentration cannot be increased beyond a given level to achieve a desired withstand voltage. That is, for a vertical MOSFET, the ON resistance and withstand voltage are in a tradeoff relationship.

A known solution to improve this is a so-called super junction structure in which a semiconductor region of a second conductivity type such as p type and a semiconductor region of the first conductivity type such as n type are arranged alternately or in a striped pattern in the region where withstand voltage is demanded. When a vertical MOSFET having a super junction structure is ON, a current flows through the first conductivity type conduction layer. When the MOSFET is OFF, the second conductivity type semiconductor region and the N region of the first conductivity type conduction layer become completely depleted. Thus, the super junction structure provides a demanded withstand voltage.

For example, the following three methods are known for manufacturing the super junction structure:

(1) Introduce n- and p-type impurities separately into a Si epitaxial layer through ion implantation and stack one epitaxial structure above another a plurality of times.

(2) Form trenches in a thick epitaxial layer and provide an impurity layer on the side surfaces of the trenches by diffusion or other means so as to embed an insulating or non-conductive substance in the trenches.

(3) Form trenches in a thick epitaxial layer and fill the trenches with a silicon epitaxial layer containing an impurity.

The third method may be able to provide a super junction structure with a high integration by a small number of process steps. For example, it has been proposed to form a super junction region by introducing a new idea to the crystal plane orientation of the wafer and to the method of forming a super junction structure (refer, for example, to Japanese Patent Laid-Open No. 2007-173734).

SUMMARY OF THE INVENTION

However, the above third method has problems to be solved. Such problems include the manufacturing conditions adapted to prevent generation of voids during the epitaxial growth in the trenches and controlling the amount of doping impurity. In particular, the crystal plane orientation which appears during the formation of trenches is likely to produce a difference in epitaxial growth speed and impurity concentration. Therefore, it is important to not only control the crystal plane orientation but also prevent the generation of voids during epitaxial growth so as to find productive conditions.

In light of the foregoing, there is a need for the present invention to provide a semiconductor device which keeps the impact of voids on the transistor characteristics to a minimum and offers high withstand voltage and excellent body diode recovery characteristic, and a manufacturing method of the same.

A semiconductor device of an embodiment of the present invention includes a first conductivity type pillar region and second conductivity type pillar regions on a first conductivity type semiconductor base body. The first conductivity type pillar region includes a first conductivity type semiconductor region integrally formed to cover the entire surface of the first conductivity type semiconductor base body. On the other hand, the second conductivity type pillar regions include a second conductivity type semiconductor region periodically arranged in the direction approximately parallel to the main surface of the first conductivity type semiconductor base body and arranged in a striped pattern in approximately the same direction as the first conductivity type pillar region.

Further, element and termination regions are provided in the first and second conductivity type pillar regions. Transistors are formed in the element region. No transistors are formed in the termination region.

Body regions of the transistors in the element region are formed on the surface of the first conductivity type pillar region and in contact with the second conductivity type pillar regions. The body regions include a second conductivity type semiconductor region. Further, a gate insulating film is formed on the first conductivity type pillar region and body regions. Gate electrodes are formed on the gate insulating film in such a manner as to straddle part of the body regions and part of the surface of the first conductivity type pillar region. On the surface of the body regions at the end portions of the gate electrode, source regions and body potential extraction regions are provided. The source regions include a first conductivity type semiconductor region. The body potential extraction regions include a second conductivity type impurity diffusion layer. Still further, voids are formed in the second conductivity type pillar regions of the termination region.

Further, a semiconductor device manufacturing method of the embodiment of the present invention includes a step of epitaxially growing a first conductivity type semiconductor layer on the main surface of a first conductivity type semiconductor base body and a step of forming an oxide film on the surface of the epitaxially grown first conductivity type semiconductor layer. The semiconductor device manufacturing method further includes a step of forming a resist layer on the oxide film, a step of forming, in the resist layer, a resist pattern having opening portions periodically arranged in the direction approximately parallel to the main surface of the semiconductor base body, and a step of removing the oxide film by using the resist pattern as a mask. The semiconductor device manufacturing method still further includes a step of forming trenches by removing, after the removal of the resist pattern, the epitaxially grown first conductivity type semiconductor layer by using the oxide film as a mask, and a step of removing the oxide film used as a mask during the formation of the trenches.

The semiconductor device manufacturing method still further includes a step of filling the trenches with a second conductivity type semiconductor layer to form first and second conductivity type pillar regions in such a manner that the first and second conductivity type pillar regions are arranged periodically in the direction approximately parallel to the main surface of the semiconductor base body. In this step, a void is formed in each of the second conductivity type pillar regions.

The semiconductor device manufacturing method still further includes a step of forming a gate insulating film on the surface of the first and second conductivity type pillar regions in the element region and a step of forming gate electrodes on the gate insulating film. The semiconductor device manufacturing method still further includes a step of forming second conductivity type body regions on the epitaxially grown first conductivity type semiconductor layer, a step of forming first conductivity type source regions on the body regions, and a step of forming second conductivity type body potential extraction regions on the body regions.

In the semiconductor device of the embodiment of the present invention and the semiconductor device manufactured by the semiconductor device manufacturing method of the embodiment of the present invention, a void is formed in each of the second conductivity type pillar regions of the termination region where no transistors are formed. The formation of voids in the second conductivity type pillar regions of the termination region provides a faster reverse recovery characteristic of the body diode. The voids act as recombination centers during the reverse recovery, thus shortening the lifetime of hole current (minority carrier). This provides a shorter reverse recovery characteristic of the body diode, thus contributing to improved avalanche resistance.

The embodiment of the present invention provides a semiconductor device which offers high withstand voltage and excellent body diode recovery characteristic.

DETAILED DESCRIPTION OF THE PREFERRED EMBODIMENTS

Figure 1:
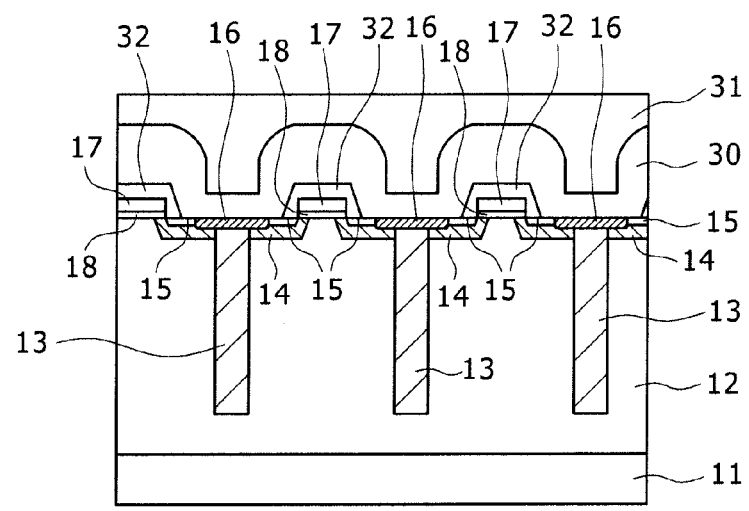
FIG. 1 is a schematic configuration diagram for describing the configuration of a semiconductor device according to a first embodiment of the present invention.

Although the best modes for carrying out the present invention will be described below, the present invention is not limited thereto.

It should be noted that the description will be given in the following order:
1. First embodiment of the semiconductor device
2. Second embodiment of the semiconductor device
3. Third embodiment of the semiconductor device
4. Fourth embodiment of the semiconductor device
5. Other embodiments of the semiconductor device
6. Manufacturing method of the semiconductor devices according to the embodiments 1. First Embodiment of the Semiconductor Device

[Configuration of the Vertical MOSFET]
FIG. 1 is a schematic configuration diagram of a vertical MOSFET (Metal Oxide Semiconductor Field Effect Transistor) as a semiconductor device according to the present embodiment.

In the semiconductor device, a pillar region (n pillar region) 12 is formed on the main surface of a first conductivity type semiconductor base body 11. The n pillar region 12 includes a first conductivity type (n type) semiconductor region. The semiconductor base body 11 includes a first conductivity type ($n^+$ type) semiconductor layer having a high impurity concentration. The semiconductor base body 11 serves as a drain region of the MOSFET. On the other hand, the n pillar region 12 serves as a first conductivity type (n type) drift region of the MOSFET.

Pillar regions (p pillar regions) 13 are formed in the n pillar region 12. The p pillar regions 13 include a second conductivity type (p type) semiconductor region and are periodically arranged in the direction approximately parallel to the main surface of the drain region 11. The n pillar region 12 and p pillar regions 13 form a so-called super junction structure. That is, the n pillar region 12 and p pillar regions 13 are adjacent to each other to form p-n junctions.

Body regions 14 are formed on and in contact with the p pillar regions 13. The body regions 14 each include a second conductivity type (p type) semiconductor region. As with the pillar regions 13, the body regions 14 are adjacent to a first conductivity type n pillar region 12 to form p-n junctions.

Further, a gate insulating film 18 and gate electrodes 17 are provided on the n pillar region 12 and body regions 14.

The gate insulating film 18 and gate electrodes 17 are formed in such a manner as to straddle part of the body regions 14 and part of the n pillar region 12.

Further, on the surfaces of the body regions 14, source regions 15 are selectively formed where the end portions of the gate electrodes 17 and those of the source regions 15 overlap each other. The source regions 15 each include a first conductivity type semiconductor region. Still further, on the surfaces of the body regions 14, potential extraction regions (backgates) 16 adapted to extract the potentials of the body regions 14 are formed, each adjacent to the source region 15. The potential extraction regions 16 each include a second conductivity type semiconductor region.

Further, an insulating layer 32 is provided on the gate electrodes 17 to cover the same electrodes 17. The insulating layer 32 is formed in such a manner as to straddle part of the source regions 15 formed on the body regions 14. It should be noted that the insulating layer 32 is not formed on the backgates 16 and part of the source regions 15.

A metal wiring 30 is formed on the insulating layer 32 and body regions 14. The metal wiring 30 connects the source regions 15 and backgates 16 together. A passivation layer 31 is formed on the metal wiring 30.

In the above semiconductor device, when a voltage is applied to the gate electrodes 17, channel regions are formed in the body regions 14 immediately under the gate electrodes 17 between the source regions 15 and n pillar region 12. This causes electrons to move from the source regions 15 to the n pillar region 12. A current flows through the substrate as the electrons move from the n pillar region 12 to the drain region which includes the semiconductor base body 11.

In the vertical MOSFET configuration shown in FIG. 1, the second conductivity type p pillar regions 13 and the first conductivity type n pillar region 12 have the same impurity concentration. This causes the p pillar regions 13 and n pillar region 12 to be completely depleted when a reverse bias is applied between the drain and source with the transistor turned off, thus providing a uniform electric field distribution.

The semiconductor device configuration shown in FIG. 1, therefore, provides high withstand voltage even if the impurity concentration of the n pillar region 12 is increased greater than when a super junction structure is not used. Further, because the impurity concentration of the n pillar region can be increased, a resistance Ron with the transistor turned on can be reduced. That is, the semiconductor device configured as described above achieves compatibility between high element withstand voltage and low resistance Ron.

Pillar Structure of the Semiconductor Device According to the First Embodiment

Figure 2:
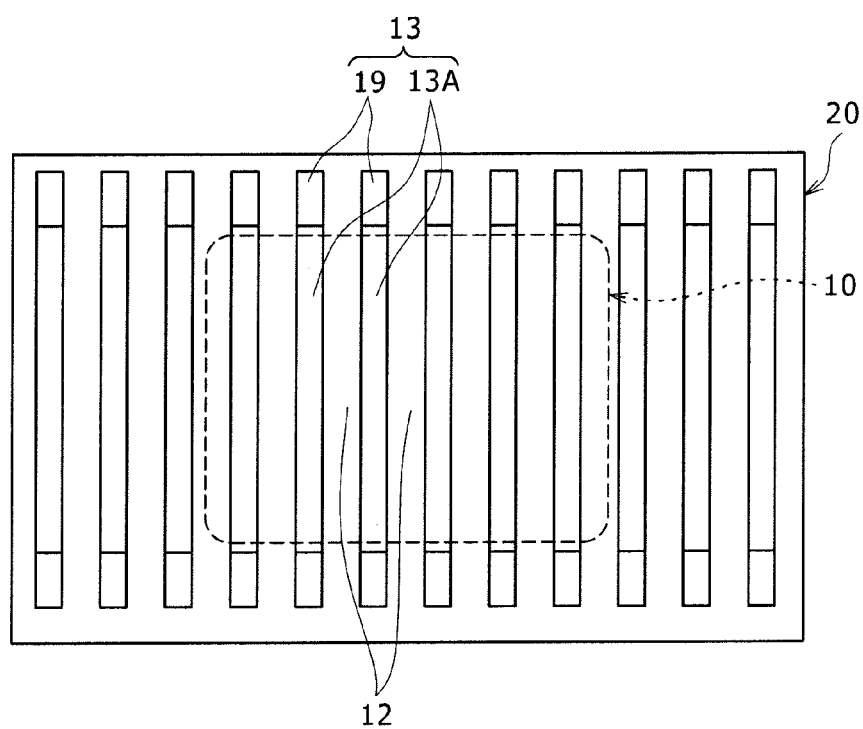
FIG. 2 is a diagram illustrating a super junction structure of the semiconductor device shown in FIG. 1.

Next, FIG. 2 illustrates a perspective view of the n pillar region 12 and p pillar regions 13 having a super junction structure as seen from above the semiconductor device in the vertical MOSFET shown in FIG. 1.

As illustrated in FIG. 2, the super junction structure in the vertical MOSFET is made up of the n pillar region 12 including a first conductivity type semiconductor region and the p pillar regions 13 including a second conductivity type semiconductor region. The n pillar region 12 and the p pillar regions 13 are arranged approximately in the same direction and alternately in a striped pattern. As described above, the n pillar region 12 includes a semiconductor epitaxial layer of the first conductivity type such as n type, while the p pillar regions 13 include a semiconductor epitaxial layer of the second conductivity type such as p type.

In order to form the above super junction structure, a first conductivity type epitaxial layer is formed over the entire surface of a high concentration first conductivity type ($n^+$ type) semiconductor base body, followed by the formation of trenches in the first conductivity type epitaxial layer. These trenches are formed where a second conductivity type (p type) pillar region is formed. Then, a second conductivity type semiconductor epitaxial layer is formed in the trenches, thus forming the p pillar region 13. Further, the surface is planarized, for example, by CMP (Chemical Mechanical Polish), thus forming above super junction structure.

It should be noted that, in order to form a practical vertical MOSFET, the components making up the transistor are formed. Such components include a second conductivity type body region, gate insulating film, gate electrode, source and drain, insulating film and wiring.

In the perspective view of the semiconductor device shown in FIG. 2, the region enclosed by the dashed line is an element region 10 where transistors, each made up of the above-mentioned body region, gate electrode, source and drain and other components, are formed.

On the other hand, the region outside the dashed line is a termination region 20 where no transistors or other elements are formed.

In FIG. 2, the p pillar regions 13 in the element region 10 are shown as p pillar regions 13A, and the p pillar regions 13 in the termination region as p pillar regions 19.

As described above, the termination region 20 is provided around the element region 10 in a high withstand voltage vertical MOSFET. Thanks to the termination region 20 provided properly around the element region 10, a depletion region can be spread into the termination region 20, thus providing high withstand voltage. That is, it is possible to spread the depletion region as far as to the n pillar region 12 and p pillar regions 13 in the termination region outside the element region 10 where transistors and other elements are formed when a voltage is applied to the drain with the transistor turned off, thus providing high withstand voltage.

For example, in the absence of the termination region 20 in the semiconductor device having the n pillar region 12 and p pillar regions 13 formed with an impurity concentration of the order of $2\times10^{15}$ to $6\times10^{15}$, the electric field in the element region 10 cannot be relieved, thus resulting in a withstand voltage of only 50 to 60 V. However, it is possible to provide a withstand voltage of up to 600 V or so by forming the termination region 20 properly around the element region 10.

As described above, if the depletion region can be spread outside the element region where transistors and other elements are formed, the electric field is relieved, thus providing a semiconductor device with high withstand voltage.

Further, the semiconductor device according to the present embodiment has a void formed in each of the p pillar regions 19 which are formed in the termination region 20.

In order to form voids in the p pillar regions 19, the p pillar regions 19 in the termination region 20 differ in width from the p pillar regions 13A in the element region 10. For example, the end portions of the p pillar regions 19 in the termination region 20 are formed wider than the p pillar regions 13A in the element region 10.

If there is a difference in width between the p pillar regions 13 in the element region 10 and those in the termination region 20 as described above, the volume ratio between the p pillar regions 13 and n pillar region 12 is different between the element region 10 and termination region 20. At this time, if the impurity concentration of the p pillar regions 13 is the same between the element region 10 and termination region 20, there is a difference in total amount of charge between the element region 10 and termination region 20 because of the difference in volume ratio between the p pillar regions 13 and n pillar region 12. Thus, because of the difference in total amount of charge between the element region 10 and termination region 20, there is a difference in impurity concentration for providing the maximum withstand voltage between the element region 10 and termination region 20.

The withstand voltage of the termination region 20 can be increased greater than that of the element region 10 by adjusting the impurity concentration of the p pillar regions 13 and n pillar region 12. Such a configuration allows for arbitrary choice between the element and termination regions as a breakdown location of the semiconductor device. Therefore, it is possible to arbitrarily choose between the element region 10 and termination region 20 as a breakdown location of the semiconductor device by selecting the impurity concentration of the p pillar regions 13 and n pillar region 12. This makes it possible to ensure that breakdown occurs only in the element region 10.

It should be noted that there is a slight difference in width between the end portions of the p pillar regions in the termination and element regions. Therefore, the p pillar regions in the termination and element regions are shown to be roughly equal in width in FIG. 2 and FIG. 3 which will be described later.

As described above, the withstand voltage of the semiconductor device is determined dependently on the withstand voltage of the element region 10 if the withstand voltage of the termination region 20 is increased greater than that of the element region 10. With the semiconductor device in a breakdown condition, therefore, a breakdown occurs in the element region 10 where the metal wiring 30 is formed.

In the event of a breakdown in the termination region 20, a breakdown current flows, for example, through silicon, a material relatively high in resistance, into the metal wiring 30. This breakdown current produces heat in the silicon during its passage and in the breakdown region, possibly destroying the semiconductor device and resulting in degraded reliability.

In contrast, the metal wiring 30 connected to the source region 15 is formed on the element region 10 of the semiconductor device. In the event of a breakdown in the element region 10, a breakdown current flows immediately through the metal wiring 30. This keeps the heat generation due to the breakdown in the element region 10 smaller than that in the termination region 20, thus providing improved reliability of the semiconductor device.

Figure 3:
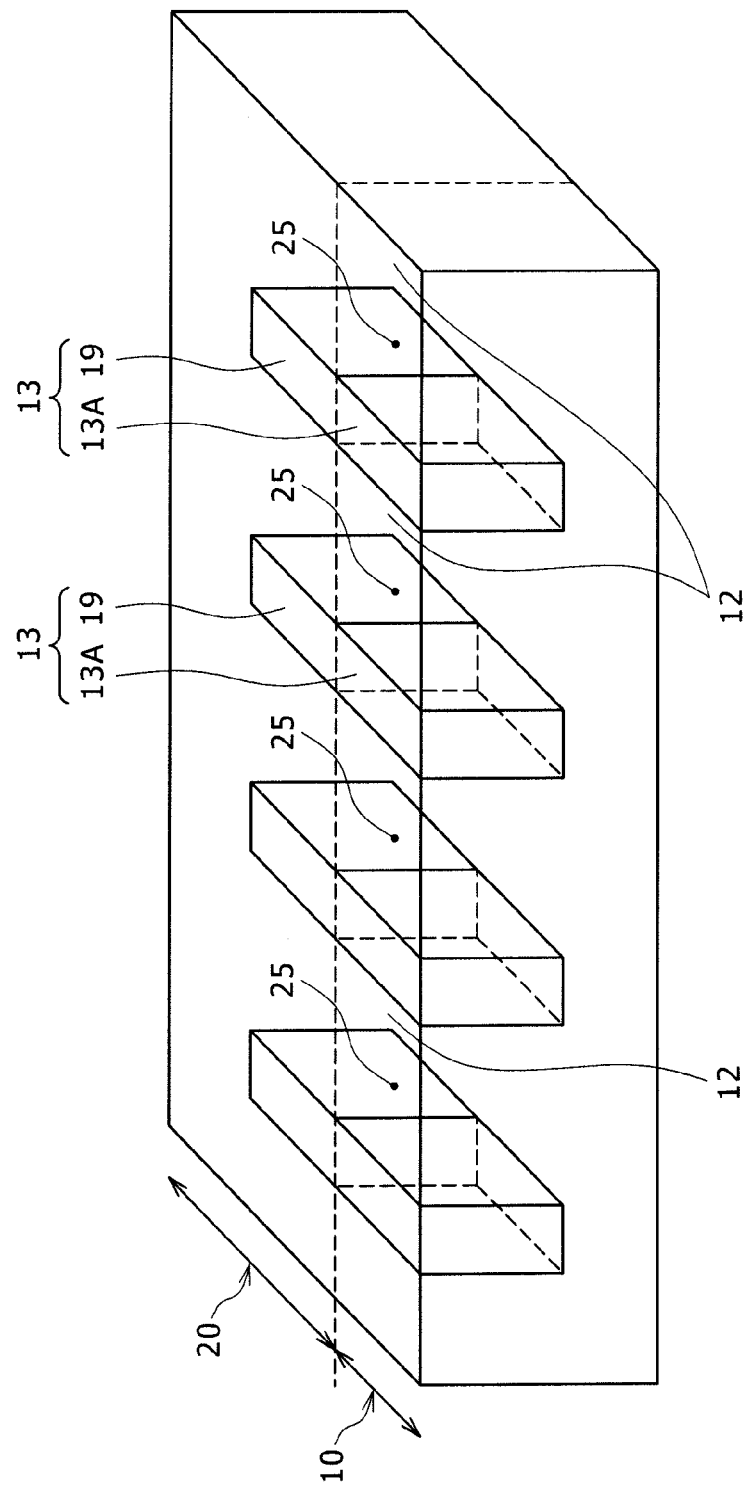
FIG. 3 is a schematic configuration diagram illustrating an enlarged view of the boundary between element and termination regions and the area in its close proximity in the super junction structure of the semiconductor device shown in FIG. 2.

FIG. 3 is a schematic configuration diagram illustrating an enlarged view of the boundary between the element region 10 and termination region 20 and the area in its close proximity in the vertical MOSFET having the super junction structure shown in FIG. 2.

As illustrated in FIG. 3, the p pillar regions 13 are embedded in the n pillar region 12. Here, the p pillar regions 13 in the element region 10 are shown as the p pillar regions 13A, and those in the termination region as the p pillar regions 19, as illustrated in FIG. 2.

Further, a void 25 is formed in each of the p pillar regions 19 of the termination region 20.

The voids 25 formed in the p pillar regions 19 provide more recombination centers than ordinary bulk silicon. This leads to a slightly larger leak current and shorter carrier lifetime. The formation of voids in the termination region 20 contributes to a faster reverse recovery characteristic of the body diode. The voids act as recombination centers during the reverse recovery, thus shortening the lifetime of hole current (minority carrier). This provides a shorter reverse recovery characteristic of the body diode.

Further, the above vertical MOSFET has the voids 25 only in the termination region 20 and not in the element region 10. Generally, the presence of voids leads to a slight increase in leak current. Nevertheless, the above configuration can provide a semiconductor device or the above vertical MOSFET having a super junction structure without increasing the leak current.

2. Second Embodiment of the Semiconductor Device

Pillar Structure of the Semiconductor Device According to the Second Embodiment

Figure 4:
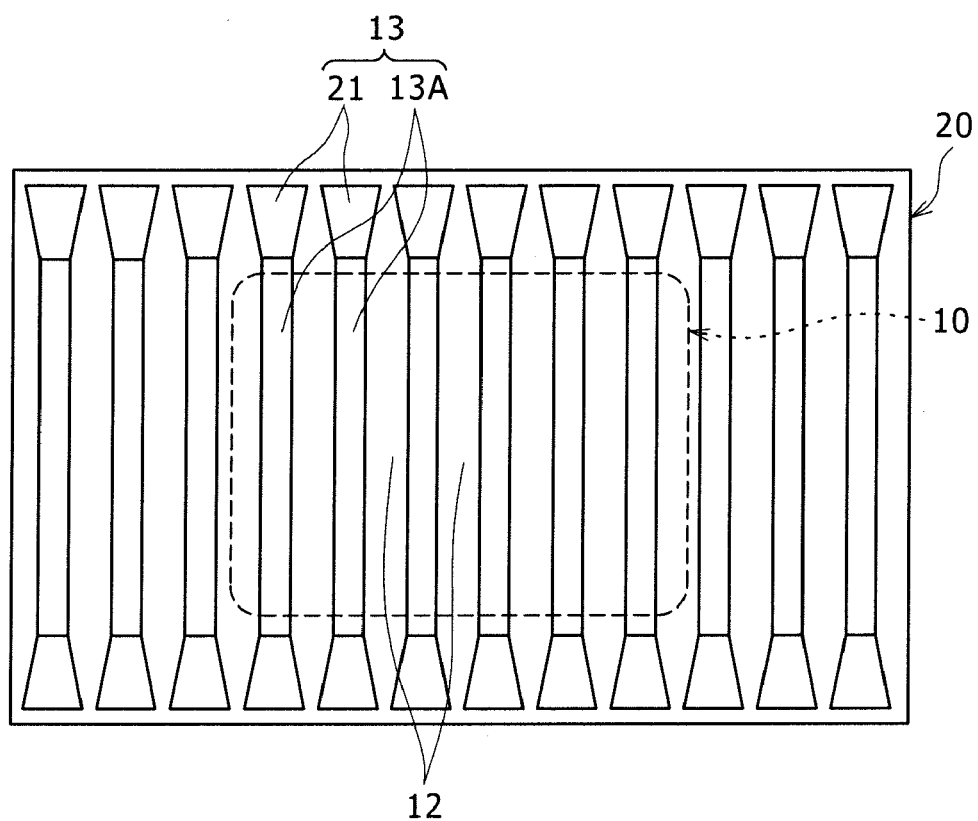
FIG. 4 is a diagram illustrating the super junction structure of the semiconductor device according to a second embodiment of the present invention.

Next, FIG. 4 illustrates, as a second embodiment of the semiconductor device, a top perspective view of a super junction structure made up of the n pillar region 12 and p pillar regions 13 in the vertical MOSFET shown in FIG. 1. This super junction structure differs in configuration from that shown in FIGS. 2 and 3.

It should be noted that the second embodiment may have the same configuration as the first embodiment shown in FIG. 1 except for the pillar regions. Therefore, only the pillar regions are shown in FIG. 4. Further, like components as those shown in FIGS. 1 to 3 are denoted by the same reference symbols, and the detailed description thereof will be omitted.

As illustrated in FIG. 4, the super junction structure of the vertical MOSFET includes the n pillar region 12 made of a first conductivity type semiconductor, and the second conductivity type p pillar regions 13. The n pillar region 12 and p pillar regions 13 are arranged alternately. As described above, the n pillar region 12 includes a semiconductor epitaxial layer of the first conductivity type such as n type, while the p pillar regions 13 include a semiconductor epitaxial layer of the second conductivity type such as p type.

The region enclosed by the dashed line in FIG. 4 is the element region 10 where transistors and other elements are formed. The region outside the dashed line is the termination region 20 where no transistors or other elements are formed.

In FIG. 4, the p pillar regions 13 in the element region 10 are shown as the p pillar regions 13A, and the p pillar regions 13 in the termination region as p pillar regions 21.

The p pillar regions 21 in the termination region 20 differ in shape from the p pillar regions 13A in the element region 10. In the case of the semiconductor device shown in FIG. 4, the p pillar regions 21 in the termination region 20 are formed so as to gradually increase in thickness from where they come in contact with the p pillar regions 13A in the element region 10 toward the end portion of the semiconductor device. That is, the p pillar regions 21 in the termination region 20 are formed approximately trapezoidal as seen from above the semiconductor device. The shorter of the parallel sides of each trapezoid is connected to one of the p pillar regions 13A in the element region 10.

Further, the p pillar regions 13 have their ends located in the p pillar regions 21 of the termination region 20. Both ends thereof are trapezoidal in shape as described above.

Still further, in the semiconductor device according to the present embodiment, a void is formed in each of the p pillar regions 21 which are formed in the termination region 20.

Figure 5:
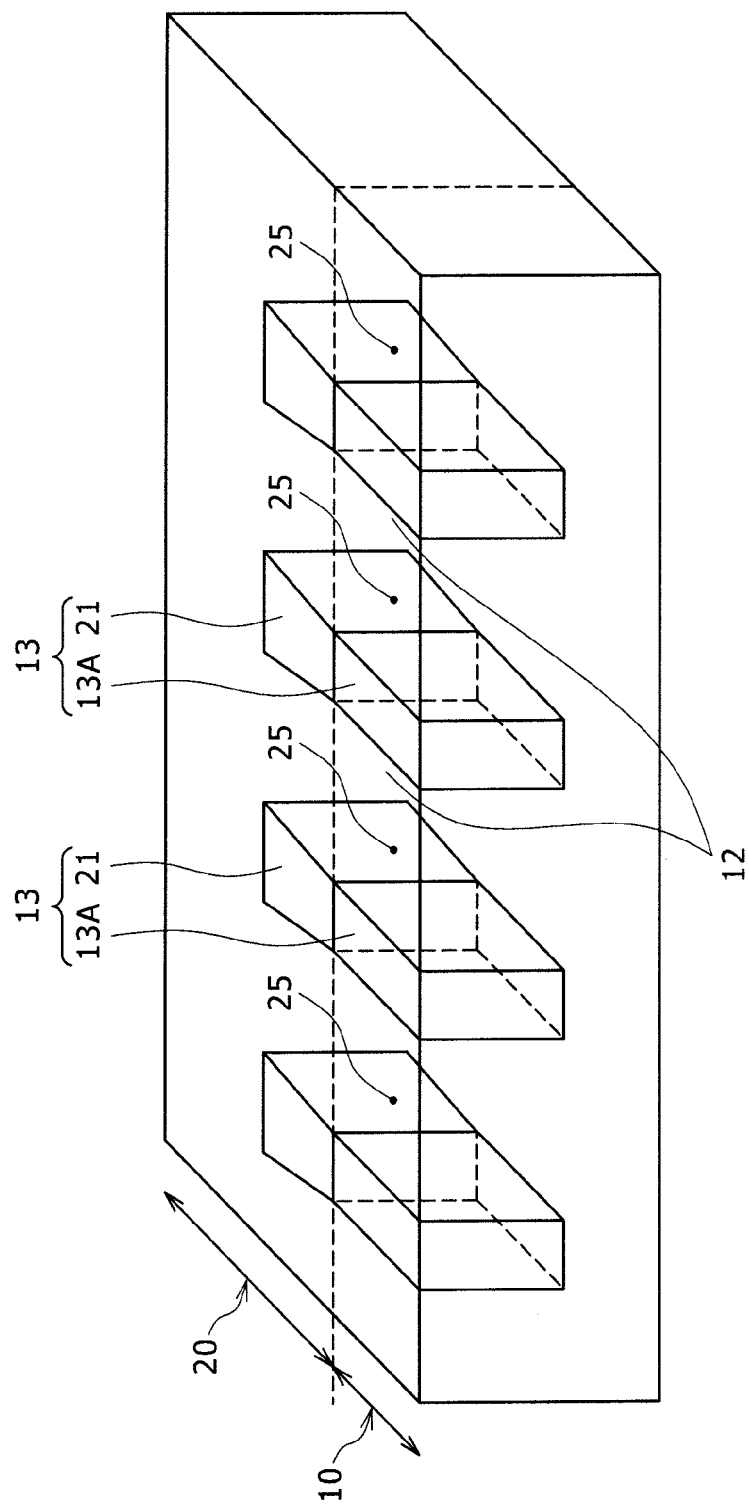
FIG. 5 is a schematic configuration diagram illustrating an enlarged view of the boundary between the element and termination regions and the area in its close proximity in the super junction structure of the semiconductor device shown in FIG. 4.

FIG. 5 is a schematic configuration diagram illustrating an enlarged view of the boundary between the element region 10 and termination region 20 and the area in its close proximity in the vertical MOSFET having the super junction structure shown in FIG. 4.

As illustrated in FIG. 5, the p pillar regions 13 are embedded in the n pillar region 12. Further, the void 25 is formed in each of the p pillar regions 21 of the termination region 20.

The semiconductor device configured as described above provides the same advantageous effects as the semiconductor device according to the first embodiment. For example, the presence of the voids 25 in the p pillar regions 21 of the termination region 20 contributes to a faster reverse recovery characteristic of the body diode. The voids 25 act as recombination centers during the reverse recovery, thus shortening the lifetime of hole current (minority carrier). This provides a shorter reverse recovery characteristic of the body diode.

Further, if the p pillar regions 21 in the termination region 20 are trapezoidal in shape as described above, the volume ratio between the p pillar regions 13 and n pillar region 12 is different between the element region 10 and termination region 20. At this time, if the impurity concentration of the p pillar regions 13 is the same between the element region 10 and termination region 20, there is a difference in total amount of charge between the element region 10 and termination region 20 because of the difference in volume ratio between the p pillar regions 13 and n pillar region 12. Thus, because of the difference in total amount of charge between the element region 10 and termination region 20, there is a difference in impurity concentration for providing the maximum withstand voltage between the element region 10 and termination region 20.

The withstand voltage of the termination region 20 can be increased greater than that of the element region 10 by adjusting the impurity concentration of the p pillar regions 13 and n pillar region 12. Such a configuration allows for arbitrary choice between the element and termination regions as a breakdown location of the semiconductor device. Therefore, it is possible to arbitrarily choose between the element region 10 and termination region 20 as a breakdown location of the semiconductor device by selecting the impurity concentration of the p pillar regions 13 and n pillar region 12. This makes it possible to ensure that breakdown occurs only in the element region 10.

In the event of a breakdown in the termination region 20, a breakdown current flows, for example, through silicon, a material relatively high in resistance, into the metal wiring 30. This breakdown current produces heat in the silicon during its passage and in the breakdown region, possibly destroying the semiconductor device and resulting in degraded reliability.

In contrast, the metal wiring 30 connected to the source region 15 is formed on the element region 10 of the semiconductor device. In the event of a breakdown in the element region 10, a breakdown current flows immediately through the metal wiring 30. This keeps the heat generation due to the breakdown in the element region 10 smaller than that in the termination region 20, thus providing improved reliability of the semiconductor device.

3. Third Embodiment of the Semiconductor Device

Pillar Structure of the Semiconductor Device According to the Third Embodiment

Figure 6:
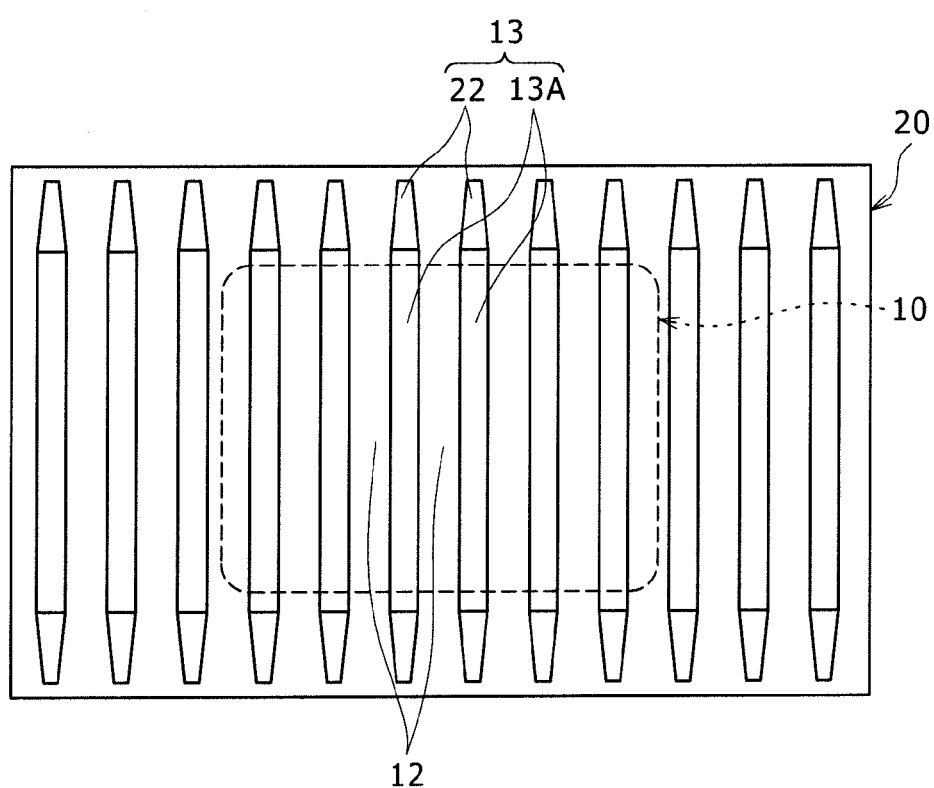
FIG. 6 is a diagram illustrating the super junction structure of the semiconductor device according to a third embodiment of the present invention.

Next, FIG. 6 illustrates, as a third embodiment of the semiconductor device, a top perspective view of a super junction structure made up of the n pillar region 12 and p pillar regions 13 in the vertical MOSFET shown in FIG. 1. This super junction structure differs in configuration from the super junction structure shown in FIGS. 2 and 3.

It should be noted that the third embodiment may have the same configuration as the first embodiment shown in FIG. 1 except for the pillar regions. Therefore, only the pillar regions are shown in FIG. 6. Further, like components as those shown in FIGS. 1 to 3 are denoted by the same reference symbols, and the detailed description thereof will be omitted.

As illustrated in FIG. 6, the super junction structure of the vertical MOSFET includes the n pillar region 12 made of a first conductivity type semiconductor, and the second conductivity type p pillar regions 13. The n pillar region 12 and p pillar regions 13 are arranged alternately. As described above, the n pillar region 12 includes a semiconductor epitaxial layer of the first conductivity type such as n type, while the p pillar regions 13 include a semiconductor epitaxial layer of the second conductivity type such as p type.

The region enclosed by the dashed line in FIG. 6 is the element region 10 where transistors and other elements are formed. The region outside the dashed line is the termination region 20 where no transistors or other elements are formed.

In FIG. 6, the p pillar regions 13 in the element region 10 are shown as the p pillar regions 13A, and the p pillar regions 13 in the termination region as p pillar regions 22.

The p pillar regions 22 in the termination region 20 differ in shape from the p pillar regions 13A in the element region 10. In the case of the semiconductor device shown in FIG. 6, the p pillar regions 22 in the termination region 20 are formed so as to gradually decrease in thickness from where they come in contact with the p pillar regions 13A in the element region 10 toward the end portion of the semiconductor device. That is, the p pillar regions 22 in the termination region 20 are formed approximately trapezoidal as seen from above the semiconductor device. The longer of the parallel sides of each trapezoid is connected to one of the p pillar regions 13A in the element region 10.

Further, the p pillar regions 13 have their ends located in the p pillar regions 22 of the termination region 20. Both ends thereof are trapezoidal in shape as described above.

Still further, in the semiconductor device according to the present embodiment, a void is formed in each of the p pillar regions 22 which are formed in the termination region 20.

Figure 7:
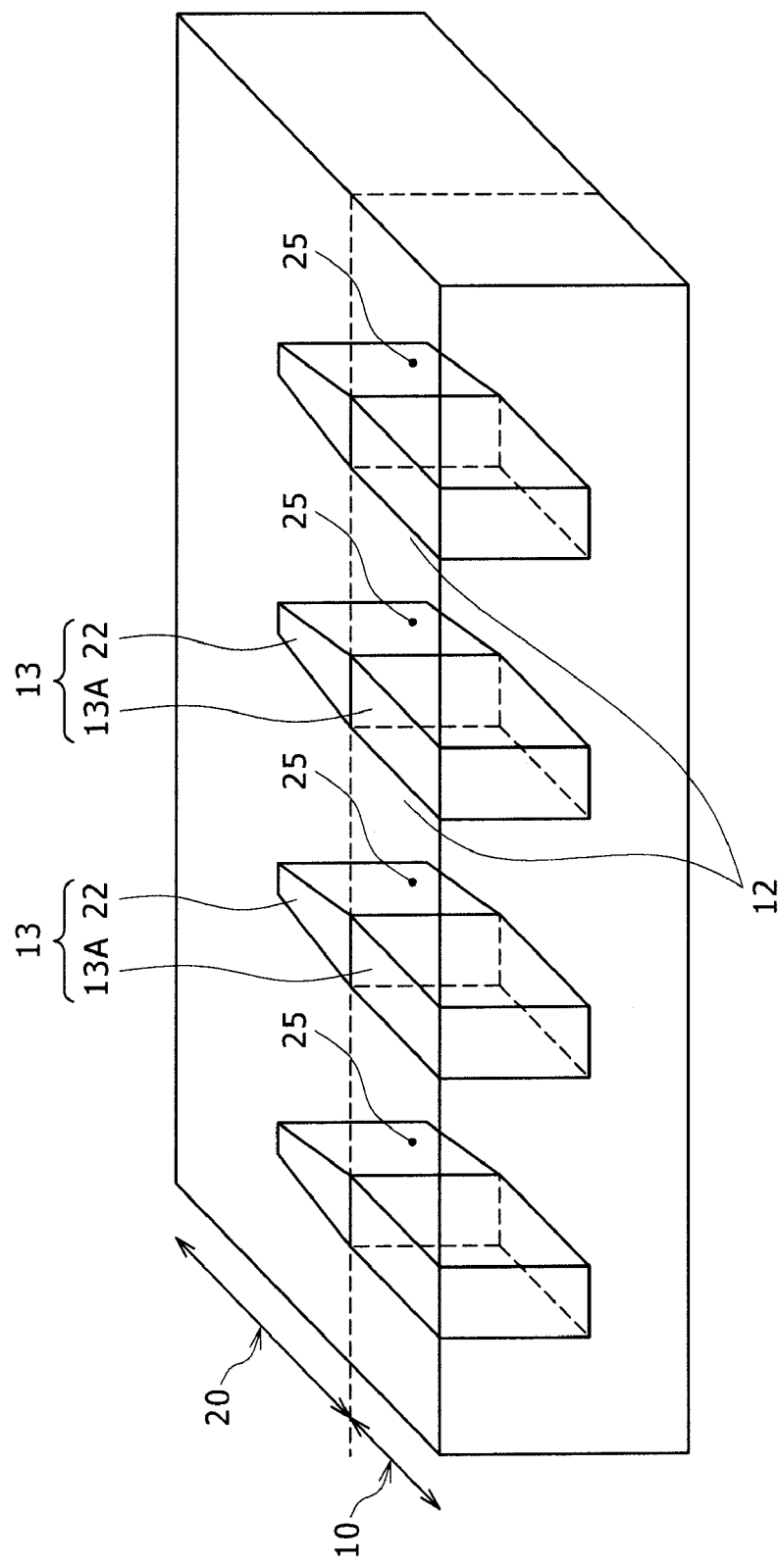
FIG. 7 is a schematic configuration diagram illustrating an enlarged view of the boundary between the element and termination regions and the area in its close proximity in the super junction structure of the semiconductor device shown in FIG. 6.

FIG. 7 is a schematic configuration diagram illustrating an enlarged view of the boundary between the element region 10 and termination region 20 and the area in its close proximity in the vertical MOSFET having the super junction structure shown in FIG. 6.

As illustrated in FIG. 7, the p pillar regions 13 are embedded in the n pillar region 12. Further, the void 25 is formed in each of the p pillar regions 22 of the termination region 20.

The semiconductor device configured as described above provides the same advantageous effects as the semiconductor device according to the first embodiment. For example, the presence of the voids 25 in the p pillar regions 22 of the termination region 20 contributes to a faster reverse recovery characteristic of the body diode. The voids 25 act as recombination centers during the reverse recovery, thus shortening the lifetime of hole current (minority carrier). This provides a shorter reverse recovery characteristic of the body diode.

Further, if the p pillar regions 22 in the termination region 20 are trapezoidal in shape as described above as with the second embodiment, the volume ratio between the p pillar regions 13 and n pillar region 12 is different between the element region 10 and termination region 20. At this time, if the impurity concentration of the p pillar regions 13 is the same between the element region 10 and termination region 20, there is a difference in total amount of charge between the element region 10 and termination region 20 because of the difference in volume ratio between the p pillar regions 13 and n pillar region 12. Thus, because of the difference in total amount of charge between the element region 10 and termination region 20, there is a difference in impurity concentration for providing the maximum withstand voltage between the element region 10 and termination region 20.

The withstand voltage of the termination region 20 can be increased greater than that of the element region 10 by adjusting the impurity concentration of the p pillar regions 13 and n pillar region 12. Such a configuration allows for arbitrary choice between the element and termination regions as a breakdown location of the semiconductor device. Therefore, it is possible to arbitrarily choose between the element region 10 and termination region 20 as a breakdown location of the semiconductor device by selecting the impurity concentration of the p pillar regions 13 and n pillar region 12. This makes it possible to ensure that breakdown occurs only in the element region 10.

In the event of a breakdown in the termination region 20, a breakdown current flows, for example, through silicon, a material relatively high in resistance, into the metal wiring 30. This breakdown current produces heat in the silicon during its passage and in the breakdown region, possibly destroying the semiconductor device and resulting in degraded reliability.

In contrast, the metal wiring 30 connected to the source region 15 is formed on the element region 10 of the semiconductor device. In the event of a breakdown in the element region 10, a breakdown current flows immediately through the metal wiring 30. This keeps the heat generation due to the breakdown in the element region 10 smaller than that in the termination region 20, thus providing improved reliability of the semiconductor device.

4. Fourth Embodiment of the Semiconductor Device

Figure 8:
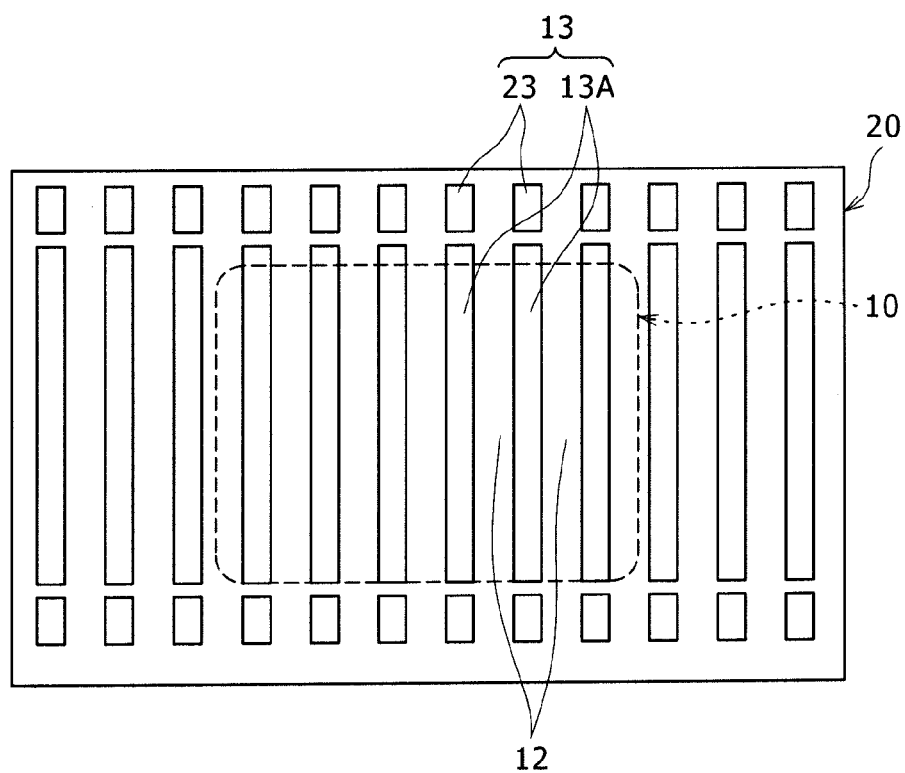
FIG. 8 is a diagram illustrating the super junction structure of the semiconductor device according to a fourth embodiment of the present invention.

Pillar Structure of the Semiconductor Device According to the Fourth Embodiment Next, FIG. 8 illustrates, as a fourth embodiment of the semiconductor device, a top perspective view of a super junction structure made up of the n pillar region 12 and p pillar regions 13 in the vertical MOSFET shown in FIG. 1. This super junction structure differs in configuration from the super junction structure shown in FIGS. 2 and 3.

It should be noted that the fourth embodiment may have the same configuration as the first embodiment shown in FIG. 1 except for the pillar regions. Therefore, only the pillar regions are shown in FIG. 8. Further, like components as those shown in FIGS. 1 to 3 are denoted by the same reference symbols, and the detailed description thereof will be omitted.

As illustrated in FIG. 8, the super junction structure of the vertical MOSFET includes the n pillar region 12 made of a first conductivity type semiconductor, and the second conductivity type p pillar regions 13. The n pillar region 12 and p pillar regions 13 are arranged alternately. As described above, the n pillar region 12 includes a semiconductor epitaxial layer of the first conductivity type such as n type, while the p pillar regions 13 include a semiconductor epitaxial layer of the second conductivity type such as p type.

The region enclosed by the dashed line in FIG. 8 is the element region 10 where transistors are formed. The region outside the dashed line is the termination region 20 where no transistors or other elements are formed.

p pillar regions 23 in the termination region 20 are rectangular in shape formed discontinuously from the p pillar regions 13A in the element region 10.

In the case of the semiconductor device shown in FIG. 8, the p pillar regions 13A are formed in the element region 10, and further the p pillar regions 23 of the termination region 20 are formed at a distance from the p pillar regions 13A of the element region 10. The n pillar region 12 mediates between the p pillar regions 13A in the element region 10 and the p pillar regions 23 in the termination region 20. Further, the p pillar regions 23 in the termination region 20 are formed rectangular with the same width as the p pillar regions 13A in the element region 10.

A depletion region can be spread into the termination region 20 when a voltage is applied to the drain with the transistor turned off also if the p pillar regions 13A in the element region 10 and the p pillar regions 23 in the termination region 20 are located at a distance from each other. This provides improved reliability of the semiconductor device as with the semiconductor device according to the first embodiment.

Figure 9:
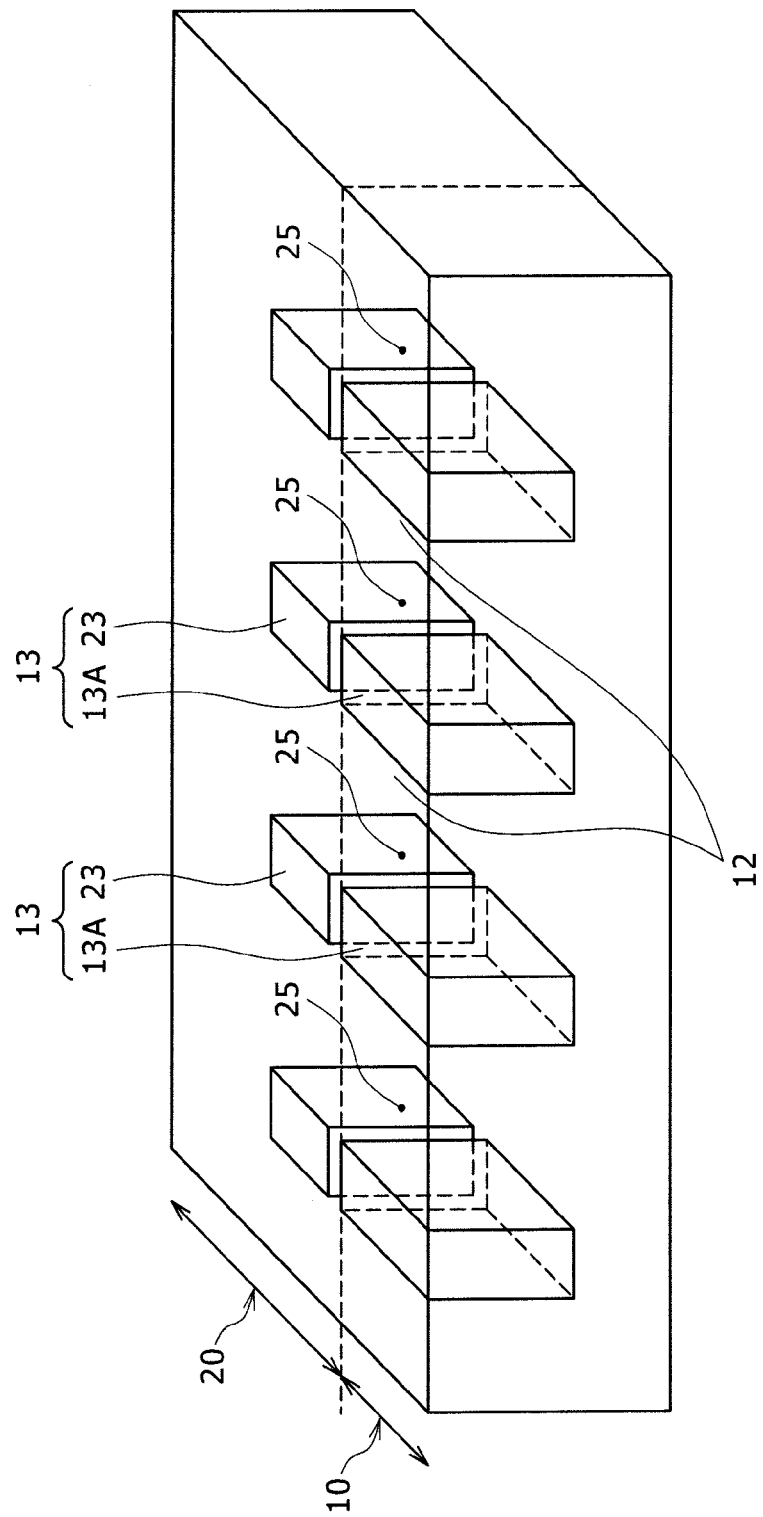
FIG. 9 is a schematic configuration diagram illustrating an enlarged view of the boundary between the element and termination regions and the area in its close proximity in the super junction structure of the semiconductor device shown in FIG. 8.

FIG. 9 is a schematic configuration diagram illustrating an enlarged view of the boundary between the element region 10 and termination region 20 and the area in its close proximity in the vertical MOSFET having the super junction structure shown in FIG. 8.

As illustrated in FIG. 9, the p pillar regions 13 are embedded in the n pillar region 12. Further, the void 25 is formed in each of the p pillar regions 23 of the termination region 20.

The semiconductor device configured as described above provides the same advantageous effects as the semiconductor device according to the first embodiment. For example, the presence of the voids 25 in the p pillar regions 21 of the termination region 20 contributes to a faster reverse recovery characteristic of the body diode. The voids 25 act as recombination centers during the reverse recovery, thus shortening the lifetime of hole current (minority carrier). This provides a shorter reverse recovery characteristic of the body diode.

Further, if the p pillar regions 13 are shaped differently between the element region 10 and termination region 20, the volume ratio between the p pillar regions 13 and n pillar region 12 is different between the element region 10 and termination region 20. At this time, if the impurity concentration of the p pillar regions 13 is the same between the element region 10 and termination region 20, there is a difference in total amount of charge between the element region 10 and termination region 20 because of the difference in volume ratio between the p pillar regions 13 and n pillar region 12. Thus, because of the difference in total amount of charge between the element region 10 and termination region 20, there is a difference in impurity concentration for providing the maximum withstand voltage between the element region 10 and termination region 20.

The withstand voltage of the termination region 20 can be increased greater than that of the element region 10 by adjusting the impurity concentration of the p pillar regions 13 and n pillar region 12. Such a configuration allows for arbitrary choice between the element and termination regions as a breakdown location of the semiconductor device. Therefore, it is possible to arbitrarily choose between the element region 10 and termination region 20 as a breakdown location of the semiconductor device by selecting the impurity concentration of the p pillar regions 13 and n pillar region 12. This makes it possible to ensure that breakdown occurs only in the element region 10.

As described above, the withstand voltage of the semiconductor device is determined dependently on the withstand voltage of the element region 10 if the withstand voltage of the termination region 20 is increased greater than that of the element region 10. With the semiconductor device in a breakdown condition, therefore, a breakdown occurs in the element region 10 where the metal wiring 30 is formed.

In the event of a breakdown in the termination region 20, a breakdown current flows, for example, through silicon, a material relatively high in resistance, into the metal wiring 30. This breakdown current produces heat in the silicon during its passage and in the breakdown region, possibly destroying the semiconductor device and resulting in degraded reliability.

In contrast, the metal wiring 30 connected to the source region 15 is formed on the element region 10 of the semiconductor device. In the event of a breakdown in the element region 10, a breakdown current flows immediately through the metal wiring 30. This keeps the heat generation due to the breakdown in the element region 10 smaller than that in the termination region 20, thus providing improved reliability of the semiconductor device.

5. Other Embodiments of the Semiconductor Device

Figure 10A:
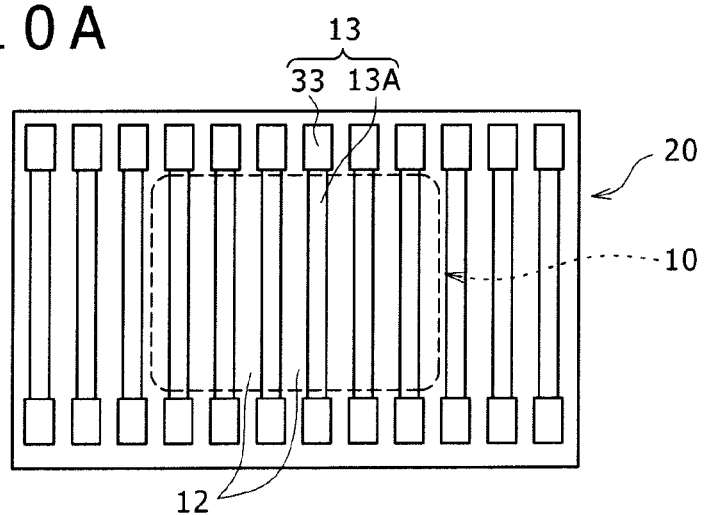
FIGS. 10A to 10C are diagrams illustrating the super junction structures of the semiconductor devices according to other embodiments of the present invention.
Figure 10B:
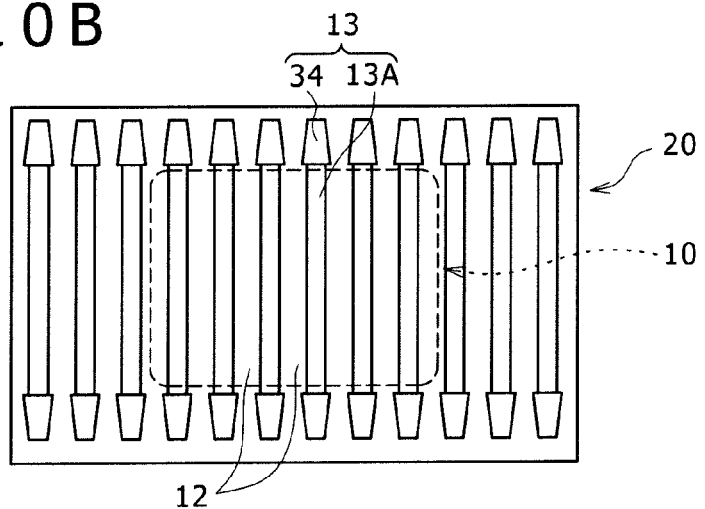
Figure 10C:
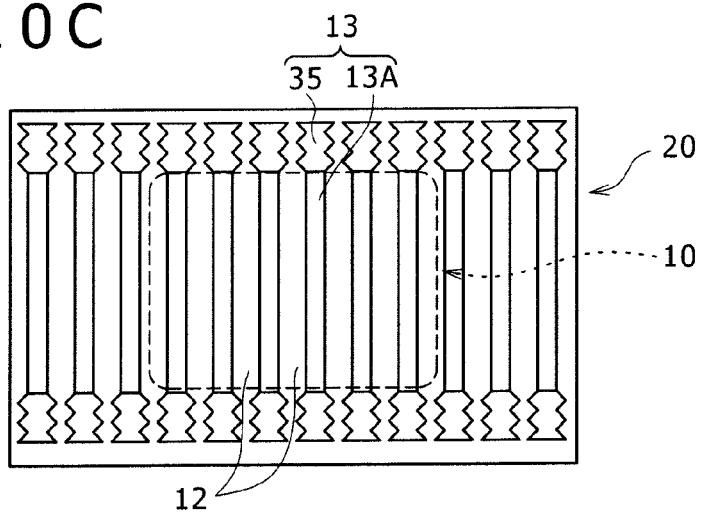

Pillar Structures of the Semiconductor Devices According to Other Embodiments Next, FIGS. 10A to 10C illustrate, as other embodiments of the semiconductor device, top perspective views of super junction structures made up of the n pillar region 12 and p pillar regions 13 in the vertical MOSFET shown in FIG. 1. These super junction structures differ in configuration from the super junction structure shown in FIGS. 2 and 3.

It should be noted that FIGS. 10A to 10C illustrate only modification examples of the configuration of the n pillar region 12 and p pillar regions 13 in the termination region 20. These embodiments may have the same configuration as the first embodiment shown in FIG. 1 except for the pillar regions. Therefore, only the pillar regions are shown in FIGS. 10A to 10C. Further, like components as those shown in FIGS. 1 to 3 are denoted by the same reference symbols, and the detailed description thereof will be omitted.

In the case of the semiconductor device shown in FIG. 10A, p pillar regions 33 in the termination region 20 are formed wider than the p pillar regions 13A in the element region 10 from where they come in contact with the p pillar regions 13A. That is, the p pillar regions 33 in the termination region 20 are formed in the shape of a rectangle wider than the p pillar regions 13A in the element region 10 as seen from above the semiconductor device. The middle portion of one of the shorter sides of each rectangle is connected to one of the p pillar regions 13A in the element region 10.

In the case of the semiconductor device shown in FIG. 10B, on the other hand, p pillar regions 34 in the termination region 20 are formed wider than the p pillar regions 13A in the element region 10 where they come in contact with the p pillar regions 13A. Further, the p pillar regions 34 in the termination region 20 are formed so as to gradually decrease in thickness toward the end portion of the semiconductor device. That is, the p pillar regions 34 in the termination region 20 are formed approximately trapezoidal as seen from above the semiconductor device. The middle portion of the longer of the parallel sides of each trapezoid is connected to one of the p pillar regions 13A in the element region 10.

In the case of the semiconductor device shown in FIG. 10C, on the other hand, p pillar regions 35 in the termination region 20 are formed wider than the p pillar regions 13A in the element region 10 where they come in contact with the p pillar regions 13A. Further, the sides of the p pillar regions 35 in the termination region 20 are formed in the shape of a wave from where they come in contact with the p pillar regions 13A toward the end portion of the semiconductor device.

Still further, in the semiconductor devices according to the embodiments shown in FIGS. 10A to 10C, voids are formed in the p pillar regions 33, 34 and 35 formed in the termination region 20. Thanks to the presence of voids in the p pillar region 21 of the termination region 20, the semiconductor devices according to these embodiments provide the same advantageous effects as the semiconductor device according to the second embodiment. Among such advantageous effects is a faster reverse recovery characteristic of the body diode.

If the volume ratio between the p pillar regions 13 and n pillar region 12 is different between the element region 10 and termination region 20, it is possible to ensure that breakdown occurs only in the element region 10, thus providing improved reliability of the semiconductor device.

6. Manufacturing Method of the Semiconductor Devices

Manufacturing Method of the Semiconductor Device According to the First Embodiment A description will be given next of the manufacturing method of the semiconductor device according to the first embodiment.

It should be noted that the semiconductor devices according to the second to fourth embodiments have the same configuration as the semiconductor device according to the first embodiment except for the structure of the n and p pillar regions. In the description of the present manufacturing method, therefore, an additional description will be made as appropriate only as to the difference between the manufacturing methods of the semiconductor devices according to the second to fourth embodiments and that of the semiconductor device according to the first embodiment.

Figure 11A:
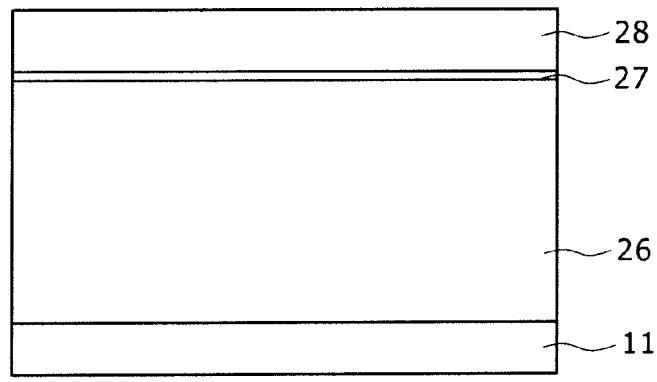
FIGS. 11A to 11C are diagrams for describing a semiconductor device manufacturing method according to the embodiments of the present invention.

First, as illustrated in FIG. 11A, the semiconductor base body 11 of the first conductivity type ($n^+$ type) having a high impurity concentration is prepared. An arsenic-doped substrate with a low resistivity of 0.0001 to 0.003 Ωcm and high impurity concentration (Nsub) is, for example, used as the semiconductor base body 11.

Then, a semiconductor layer is epitaxially grown on the main surface of the semiconductor base body 11 by doping this surface with a first conductivity type impurity such as phosphorous (P), thus forming an epitaxial layer 26 which will serve as an n pillar region. At this time, the epitaxial layer 26 is formed, for example, with a phosphorous (P) concentration of $2\times10^{15}$ cm$^{-3}$. On the other hand, the epitaxial layer is deposited with a thickness of 40 to 50 μm on the semiconductor base body 11.

Further, an oxide film 27 of about 5 μm in thickness is, for example, formed on the surface of the epitaxial layer 26. Next, a resist pattern 28 is formed on the oxide film 27.

Next, a resist pattern is formed using the resist pattern 28. This resist pattern has opening portions 36 formed on the n pillar region of the semiconductor device. The opening portions 36 are arranged periodically in the direction approximately parallel to the main surface of the semiconductor base body. For example, the resist pattern is formed with a width of about 5 μm in a striped pattern. It should be noted that the longitudinal length of the striped resist pattern and the shape of the opening portions are selected according to the configuration of the semiconductor device manufactured.

Figure 11B:
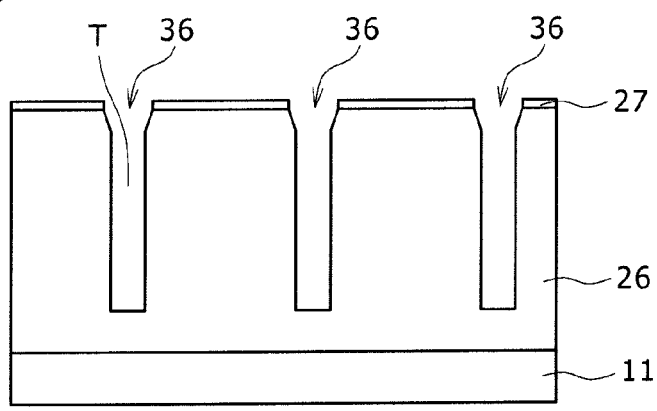

Next, the oxide film 27 formed on the epitaxial layer 26 is removed, for example, by RIE (Reactive Ion Etching) according to the formed resist pattern 28. After the resist patter 28 is removed, the epitaxial layer 26 is etched again by RIE using the oxide film 27 as a mask as illustrated in FIG. 11B, thus forming trenches T. The trenches T are formed, for example, with an aspect ratio of about 10 to 15 and a depth of about 35 to 40 μm.

Figure 11C:
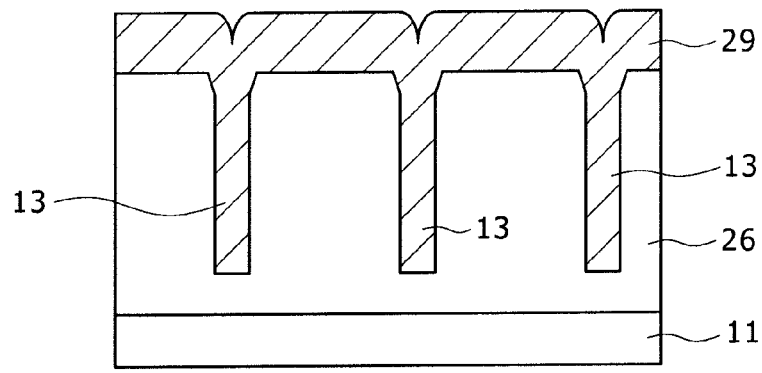

Next, after the resist pattern and oxide film are removed as illustrated in FIG. 11C, a semiconductor layer is epitaxially grown by doping the surface with a second conductivity type impurity such as boron (B), thus filling the trenches T with a second conductivity type epitaxial layer 29 which will serve as a p pillar region. At this time, the epitaxial layer 29 is formed, for example, with a boron (B) concentration of $2 \times 10^{15}$ cm$^{-3}$ to $6 \times 10^{15}$ cm$^{-3}$.

Here, voids are formed in the epitaxial layer 29 formed in the termination region of all the second conductivity type epitaxial layer 29. The void formation method will be described later.

Figure 12A:
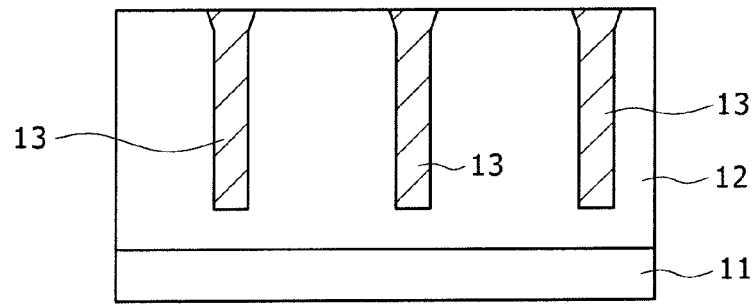
FIGS. 12A to 12C are diagrams for describing the semiconductor device manufacturing method according to the embodiments of the present invention.

Next, the excess second conductivity type epitaxial layer 29 formed on the first conductivity type epitaxial layer 26 is removed by CMP (Chemical Mechanical Polish). At the same time, the first conductivity type epitaxial layer 26 and second conductivity type epitaxial layer 29 are planarized. This step forms the n pillar region 12 and p pillar regions 13 on the semiconductor base body 11 as illustrated in FIG. 12A. The n pillar region 12 includes the first conductivity type epitaxial layer. The p pillar regions 13 include the second conductivity type epitaxial layer.

Figure 12B:
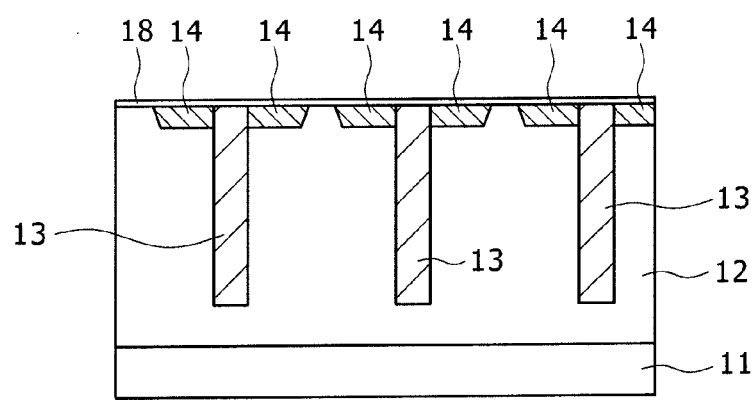

Next, as illustrated in FIG. 12B, boron (B) is ion-injected into the surface of the n pillar region 12, thus forming an impurity region. Next, the ion-injected second conductivity type impurity is thermally diffused, thus forming the second conductivity type body regions 14. Further, the gate insulating film 18 made of a thermal oxide film is formed on the surfaces of the n pillar region 12, p pillar regions 13 and body regions 14.

Figure 12C:
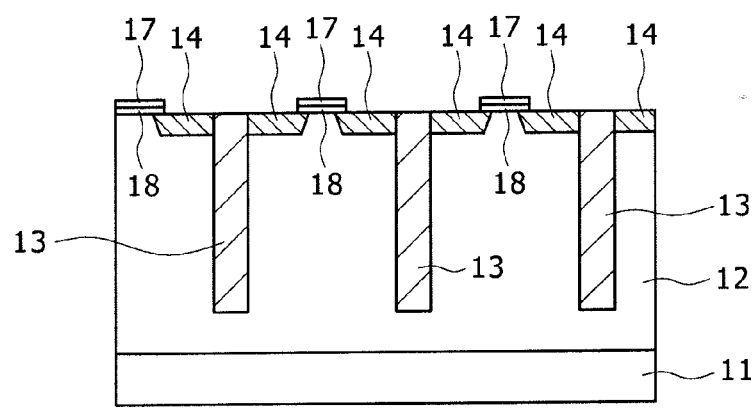

Next, the gate electrodes 17 are formed on the gate insulating film 18 as illustrated in FIG. 12C. The gate electrodes 17 are formed, for example, by CVD (Chemical Vapor Deposition) using polysilicon or other material. Further, the thermal oxide film is removed except for that under the gate electrodes 17.

Figure 13A:
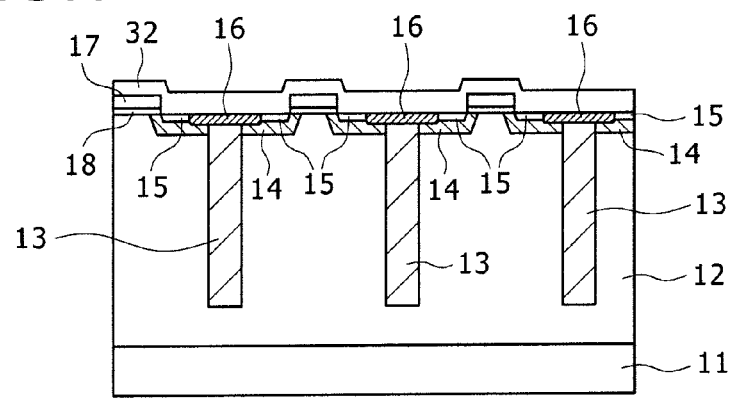
FIGS. 13A to 13C are diagrams for describing the semiconductor device manufacturing method according to the embodiments of the present invention.

Next, a first conductivity type impurity such as phosphorous (P) is ion-injected into predetermined positions of the second conductivity type body regions 14 and thermally diffused. Further, a second conductivity type impurity such as boron (B) is ion-injected into the body regions 14 and thermally diffused. This step forms the source regions 15 and potential extraction regions (backgates) 16 on the body regions 14 as illustrated in FIG. 13A. The source regions 15 each include a first conductivity type semiconductor region. The backgates 16 each include a second conductivity type semiconductor region. Further, the insulating layer 32 is formed to cover all of the gate electrodes 17, source regions 15 and backgates 16. The insulating layer 32 is formed with a thickness of 1 to 2 μm on the gate electrodes 17.

Figure 13B:
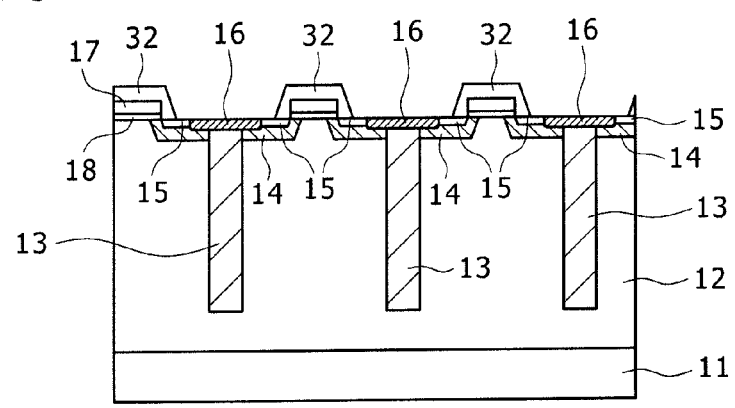

Next, as illustrated in FIG. 13B, the insulating layer 32 is removed except for that on the gate electrodes 17 and part thereof on the source regions 15. This step forms the insulating layer 32 adapted to cover the gate electrodes 17. Then, contacts are formed to connect the metal wiring to the gate electrodes 17 and backgates 16.

Figure 13C:
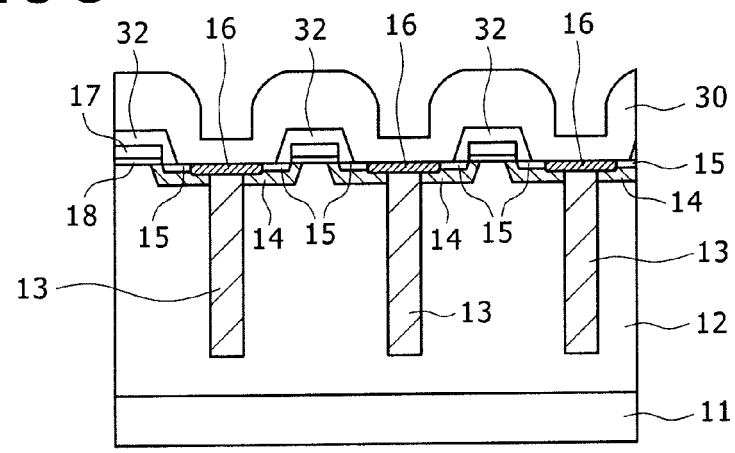

Next, as illustrated in FIG. 13C, the metal wiring 30 is formed to cover all of the insulating layer 32 on the gate electrodes 17, the source regions 15 and backgates 16. The source regions 15, backgates 16 and metal wiring 30 are electrically connected together by the formation of the metal wiring 30. The metal wiring 30 is made, for example, of Al—Cu alloy and formed with a thickness of 3 to 5 μm.

If a passivation layer is formed on the metal wiring 31, the semiconductor device configured as shown in FIG. 1 can be manufactured.

In the step of ion-injecting a second conductivity type impurity to form the body regions 14 in the above manufacturing method, the same regions 14 can be alternatively formed in a self-aligned manner by ion-injecting the impurity using the gate electrodes 17 as a mask. Similarly, in the step of ion-injecting a first conductivity type impurity to form the source regions 15, the same regions 15 can be formed in a self-aligned manner by ion-injecting the impurity using the gate electrodes 17 as a mask.

It should be noted that the semiconductor devices according to the second to fourth embodiments can be manufactured by the above manufacturing method if the shape of the trenches T formed in the first conductivity type epitaxial layer is changed. The trenches T can be changed in shape by changing the shape of the opening portions 36 in the resist pattern 28 in the step shown in FIG. 11B. In some cases, the p pillar regions in the element region and those in the termination region may be formed in different steps.

Method of Forming Voids in the P Pillar Regions of the Termination Region in the Semiconductor Device According to the First Embodiment A description will be given below of a method of forming voids in the p pillar regions of the termination region in the semiconductor device.

If the shape of the p pillar regions is the same between the element and termination regions as with the semiconductor device according to the first embodiment, the end portions of the p pillar regions in the termination region are formed, for example, wider than the p pillar regions in the element region. Such a configuration allows for voids to be formed in the p pillar regions of the termination region.

If the end portions of the p pillar regions in the termination region are formed wider than the p pillar regions, a more-than-normal number of radicals enter this area during the etching of the first conductivity type epitaxial layer by RIE to form the trenches. This gouges the end portions of the p pillar regions in the termination region more deeply than any other portions, thus forming the trenches.

The epitaxial layer in the trenches grows from the sides of the trenches. At this time, because the end portions of the p pillar regions in the termination region are gouged more deeply than any other portions, there is a difference in time for the trenches to be filled with the epitaxial layer between the element and termination regions.

Therefore, it is difficult to form a uniform epitaxial layer in the termination region under the condition of uniformly filling the trenches with the epitaxial layer in the element region without generating voids. As a result, voids are likely to be generated in the termination region.

The voids generated in the p pillar regions of the termination region should preferably be 0.1 μm or less in width, 10 μm or less in height and 10 μm or less in length.

As described above, if the end portions of the p pillar regions of the termination region are formed in the shape of a hammerhead, voids can be formed in the p pillar region of the termination region without generating voids in the p pillar regions of the element region.

The formation of the end portions in the shape of a hammerhead is achieved, for example, by designing the resist pattern shape by the following method. That is, a resist pattern is, for example, formed in advance in such a manner as to form the end portions of the p pillar regions of the termination region in the shape of a hammerhead. Alternatively, an OPC (optical proximity correction) pattern may be formed in the photomask used to form a resist pattern, thus allowing for a resist pattern to be formed in the shape of a hammerhead. Then, the oxide film formed on the first conductivity type epitaxial layer is removed by RIE according to the formed resist pattern. Further, the first conductivity type epitaxial layer is etched by RIE using the oxide film as a mask, thus forming trenches.

It should be noted that, in the configuration of the semiconductor device shown in FIG. 2, the p pillar regions are formed with the same width in the element and termination regions. As a result, the trenches are easy to form and easy to fill with an epitaxial layer.

Method of Forming Voids in the P Pillar Regions of the Termination Region in the Semiconductor Device According to the Second Embodiment Further, voids can also be formed if the shape of the p pillar regions is different between the element and termination regions as with the semiconductor device shown in FIGS. 4 and 5. In the case of the semiconductor device shown in FIGS. 4 and 5, the p pillar regions in the termination region are formed so as to gradually increase in thickness from where they come in contact with the p pillar regions in the element region toward the end portion of the semiconductor device.

If the trenches in the p pillar regions of the termination region are formed wider than those in the p pillar regions of the element region as described above, the trenches in the termination region are not completely filled when the trenches in the element region are filled with an epitaxial layer. For example, the epitaxial layer grows faster at the upper end portions than in the middle portions of the trenches. As a result, the upper end portions of the trenches are closed before the trenches are completely filled with the epitaxial layer as a result of the growth of this layer. This makes it likely that voids may be generated in the epitaxial layer of the termination region.

Therefore, it is difficult to form a uniform epitaxial layer in the termination region under the condition of uniformly filling the trenches with the epitaxial layer in the element region without generating voids. As a result, voids can be formed in the p pillar region of the termination region without generating voids in the p pillar regions of the element region.

Method of Forming Voids in the P Pillar Regions of the Termination Region in the Semiconductor Device According to the Third Embodiment Further, voids can also be formed in the p pillar regions of the termination region if the p pillar regions in the termination region are formed so as to gradually decrease in thickness from where they come in contact with the p pillar regions in the element region toward the end portion of the semiconductor device as with the semiconductor device shown in FIGS. 6 and 7.

If the trenches in the p pillar regions of the termination region are formed less wide than those in the p pillar regions of the element region as described above, the upper end portions of the trenches are closed faster than those in the element region as a result of the growth of the epitaxial layer. As a result, the upper end portions of the trenches are closed at the upper end portions as a result of the growth of the epitaxial layer before the trenches are completely filled with the epitaxial layer in the middle portions of the trenches as a result of the growth of this layer. This makes it likely that voids may be generated in the epitaxial layer of the termination region.

Therefore, it is difficult to form a uniform epitaxial layer in the termination region under the condition of uniformly filling the trenches with the epitaxial layer in the element region without generating voids. As a result, voids can be formed in the p pillar region of the termination region without generating voids in the p pillar regions of the element region.

If the shape of the p pillar regions is different between the element and termination regions as described above, there is a difference in time for the trenches to be filled with the epitaxial layer between the element and termination regions. This makes it possible to form voids in the p pillar regions of the termination region.

Method of Forming Voids in the P Pillar Regions of the Termination Region in the Semiconductor Device According to the Fourth Embodiment Further, voids can also be formed in the p pillar regions of the termination region if the p pillar regions in the termination region are formed at a distance from the p pillar regions of the element region as with the semiconductor device shown in FIGS. 8 and 9.

If the p pillar regions in the element region and those in the termination region are located at a distance from each other, the p pillar regions in the element region and those in the termination region may be, for example, formed in different steps.

In the semiconductor device according to the first embodiment, it is possible to form the p pillar regions in the element region and those in the termination region in different steps by performing the following in the trench forming step and epitaxial layer forming step.

That is, a first conductivity type epitaxial layer is formed on the semiconductor base body first as with the manufacturing method of the semiconductor device according to the first embodiment. Next, an oxide film is formed on the surface of the epitaxial layer, followed by the formation of a resist pattern only in the element region. The resist pattern is used to form p pillar regions. Then, the oxide film and first conductivity type epitaxial layer are etched by RIE, thus forming trenches only in the element region. The trenches are used to form p pillar regions. A second conductivity type epitaxial layer is formed in the formed trenches, thus filling the trenches with the second conductivity type epitaxial layer. Finally, the epitaxial layer is subjected to polishing by CMP, thus forming p pillar regions in the element region.

Similarly, a resist pattern is formed on the first conductivity type epitaxial layer formed on the semiconductor base body only in the termination region. The resist pattern is used to form p pillar regions. Then, the oxide film and first conductivity type epitaxial layer are etched by RIE, thus forming trenches only in the termination region. A second conductivity type epitaxial layer is formed in the formed trenches, thus filling the trenches with the second conductivity type epitaxial layer. Finally, the epitaxial layer is subjected to polishing by CMP, thus forming p pillar regions in the termination region.

In the aforementioned manufacturing method, voids can be formed in the p pillar regions of the termination region if the epitaxial layer in the element region is formed under different conditions from that in the termination region during the filling of the trenches. For example, the epitaxial layer is formed in the element region under the conditions which make it unlikely for voids to be generated in the epitaxial layer. Then, the epitaxial layer is formed in the termination region under the conditions which make it likely for voids to be generated in the epitaxial layer.

Such a method allows for formation of p pillar regions in the element region and those in the termination region in different steps, thus forming voids in the p pillar regions of the termination region.

Method of Forming Voids in the P Pillar Regions of the Termination Region in the Semiconductor Device According to Other Embodiments Further, voids can also be formed in the p pillar regions of the termination region as in the case of the semiconductor device according to the first embodiment if the p pillar regions in the termination region are formed rectangular and wider than those in the element region as with the semiconductor device configured as shown in FIG. 10A.

If the end portions of the p pillar regions in the termination region are formed wider than the p pillar regions, a more-than-normal number of radicals enter this area during the formation of trenches by RIE, causing this area to be gouged deeply. If the end portions of the p pillar regions in the termination region are gouged more deeply than any other portions as described above, there is a difference in time for the trenches to be filled with the epitaxial layer between the element and termination regions. As a result, it is difficult to form a uniform epitaxial layer in the termination region under the condition of uniformly filling the trenches with the epitaxial layer in the element region without generating voids, making it likely for voids to be generated in the termination region.

Further, voids can also be formed in the p pillar regions of the termination region in the semiconductor devices configured as shown in FIGS. 10B and 10C as in the semiconductor device configured as shown in FIG. 10A. For example, if the p pillar regions of the termination region are formed approximately trapezoidal as with the semiconductor device configured as shown in FIG. 10B, voids can also be formed in the p pillar regions of the termination region as in the case of the semiconductor device according to the second embodiment. Further, the sides of the p pillar regions in the termination region are formed in the shape of a wave as with the semiconductor device configured as shown in FIG. 10C, voids can also be formed in the p pillar regions of the termination region as in the case of the semiconductor devices according to the first and second embodiments.

It should be noted that voids may be generated in the p pillar regions of the termination region by methods other than the above. It is preferred that voids be generated in the termination region without generating any voids in the epitaxial layer of the element region.

On the other hand, voids may be formed in any position so long as they are formed within the p pillar regions of the termination region except when they are exposed on the surface.

It should be noted that although, in the above description, the p pillar regions in the termination region are formed trapezoidal or rectangular, the p pillar regions may be formed in any other desired shape. If the p pillar regions in the termination region are formed by epitaxial growth under the same conditions as for the p pillar regions in the element region, it is preferred that the p pillar regions in the termination region be formed in a shape which is likely to generate voids in the p pillar regions. Further, it is preferred in consideration of the characteristics of the semiconductor devices that the p pillar regions in the termination region be formed in a shape which makes it possible to control, for example, the number of voids generated.

It should be noted that, in the above embodiments of the semiconductor devices, the body regions of the second conductivity type such as p type are formed on the drift regions which include an epitaxial layer of the first conductivity type such as n type. However, n and p types may be reversed.

It should be noted that the present invention is not limited to the above embodiments but may be modified and changed without departing from the scope and spirit of the invention.

The present application contains subject matter related to that disclosed in Japanese Priority Patent Application JP 2009-017155 filed with the Japan Patent Office on Jan. 28, 2009, the entire content of which is hereby incorporated by reference.

What is claimed is:

1. A semiconductor device, comprising:
a first semiconductor body;
a first region including a first semiconductor region covering a surface of the first semiconductor body;
a second region including a second semiconductor region;
element and termination regions provided in the first and second region,
a transistor formed in the element region, and wherein there is no transistor formed in the termination region;
a body region of the transistor in the element region formed at the surface of the first region and in contact with the second region, the body region including a second semiconductor region;
wherein
a void is formed in the second region of the termination region.

2. The semiconductor device of claim 1, wherein
a gate insulating film formed on the first region and the body region;
a gate electrode formed on the gate insulating film in such a manner as to straddle part of the body region and part of the surface of the first region;
a source region formed on part of the surface of the body region at end portions of the gate electrode, the source region including a first semiconductor region.

3. The semiconductor device of claim 1, wherein
a body potential extraction region is formed on the surface of the body region, the body potential extraction region including a second impurity diffusion layer.

4. The semiconductor device of claim 1, wherein
a second region including a second semiconductor region is arranged in the direction approximately parallel to a main surface of the first semiconductor body.

5. The semiconductor device of claim 4, wherein
a second region is arranged in a striped pattern in approximately the same direction as the first region.

6. The semiconductor device of claim 1, wherein
each second region in the termination region is shaped differently from the second region in the element region.

7. The semiconductor device of claim 6, wherein
the second region in the termination region is formed so as to gradually increase in thickness from where it contacts the second region toward the end portion of the semiconductor device.

8. The semiconductor device of claim 6, wherein
the second region in the termination region is formed so as to gradually decrease in thickness from where it contacts the second region toward the end portion of the semiconductor device.

9. The semiconductor device of claim 6, wherein
the end portions of the second region in the termination region are formed with a rectangular shape and wider than the second region in the element region.

10. The semiconductor device of claim 1, wherein
each second region in the termination region is separated from the second region in the element region.

* * * * *